(12) United States Patent
Chiang

(10) Patent No.: US 6,797,557 B2
(45) Date of Patent: Sep. 28, 2004

(54) METHODS AND SYSTEMS FOR FORMING EMBEDDED DRAM FOR AN MIM CAPACITOR

(75) Inventor: Min-Hsiung Chiang, Taipei (TW)

(73) Assignee: Taiwan Semiconductor Manufacturing Co., Ltd., Hsin Chu (TW)

(*) Notice: Subject to any disclaimer, the term of this patent is extended or adjusted under 35 U.S.C. 154(b) by 115 days.

(21) Appl. No.: 09/975,840

(22) Filed: Oct. 11, 2001

(65) Prior Publication Data

US 2003/0073279 A1 Apr. 17, 2003

(51) Int. Cl.[7] ...................... H01L 21/8242; H01L 21/44
(52) U.S. Cl. ...................... 438/239; 438/682; 438/626; 438/645; 438/647; 438/649; 438/655; 257/303; 257/306; 257/296; 257/906; 361/301.4
(58) Field of Search ................... 438/239, 682, 438/626, 645, 647, 649, 655, 683, 253, 396, 640, 651; 257/303, 306, 296, 906; 361/301.4

(56) References Cited

U.S. PATENT DOCUMENTS

| | | | |
|---|---|---|---|
| 6,078,492 A | * | 6/2000 | Huang et al. ............ 361/301.4 |
| 6,096,597 A | * | 8/2000 | Tsu et al. ............... 43/240 |
| 6,146,941 A | * | 11/2000 | Huang et al. ............ 438/253 |
| 6,518,130 B1 | * | 2/2003 | Ohno .................... 438/275 |
| 6,620,674 B1 | * | 9/2003 | Itabashi et al. ......... 438/241 |

OTHER PUBLICATIONS

S. Wolf, Silicon Processing For The VLSI ERA—vol. II, PP 144–152. Lattice Press, 1995.*

* cited by examiner

Primary Examiner—Matthew Smith
Assistant Examiner—Belur Keshavan
(74) Attorney, Agent, or Firm—Tung & Associates

(57) ABSTRACT

A method and system for fabricating a capacitor utilized in a semiconductor device. A salicide gate is designated for use with the semiconductor device. A self-aligned contact (SAC) may also be configured for use with the semiconductor device. The salicide gate and the self-aligned contact are generally in a memory cell area of the semiconductor device to thereby permit the efficient shrinkage of memory cell size without an additional mask or weakening of associated circuit performance. Combining, the self-aligned contact and the salicide gate in the same memory cell area can effectively reduce gate resistance.

9 Claims, 7 Drawing Sheets

METHODS AND SYSTEMS FOR FORMING EMBEDDED DRAM FOR AN MIM CAPACITOR

TECHNICAL FIELD

The present invention relates to a semiconductor device and manufacturing method thereof. More specifically, the present invention relates to a semiconductor device having a capacitor and a contact plug in a DRAM (Dynamic Random Access Memory) or the like, and to a manufacturing method thereof. The present invention also relates to MIM capacitor fabrication methods and systems.

BACKGROUND OF THE INVENTION

A semiconductor memory, such as a DRAM, mainly consists of a transistor and a capacitor. Therefore, improvement in the efficiency of these two structures tends to be the direction in which technology is developing. DRAM is a volatile memory, and the way to store digital signals is decided by charge or discharge of the capacitor in the DRAM. When the power applied on the DRAM is turned off, the data stored in the memory cell completely disappears. A typical DRAM cell usually includes at least one field effect transistor (FET) and one capacitor. The capacitor is used to store the signals in the cell of DRAM. If more charges can be stored in the capacitor, the capacitor has less interference when the amplifier senses the data. In recent years, the memory cell of a DRAM has been miniaturized more and more from generation to generation. Even if the memory cell is minimized, a specific charge is essentially stored in the storage capacitor of the cell to store the information.

When the semiconductor enters the deep sub-micron process, the size of the device becomes smaller. For the conventional DRAM structure, this means that the space used by the capacitor becomes smaller. Since computer software is gradually becoming huge, even more memory capacity is required. In the case where it is necessary to have a smaller size with an increased capacity, the conventional method of fabricating the DRAM capacitor needs to change in order to fulfill the requirements of the trend.

There are two approaches at present for reducing the size of the capacitor while increasing its memory capacity. One way is to select a high-dielectric material, and the other is to increase the surface area of the capacitor.

There are two main types of capacitor that increase capacitor area. These are the deep trench-type and the stacked-type, where digging out a trench and filling the trench with a conductive layer, a capacitive dielectric layer and a conductive layer in sequence for the capacitor form the deep trench-type capacitor.

When a dielectric material with a relatively high dielectric constant is used in a stacked capacitor, the materials for manufacturing the upper and the bottom electrodes need to be gradually replaced in order to enhance the performance of the capacitor. A structure known as a metal-insulator-metal (MIM) structure possesses a low-interfacial reaction specificity to enhance the performance of the capacitor. Therefore, it has become an important topic of research for the semiconductor capacitor in the future.

Cell areas are reduced, as a semiconductor device needs ultra-high integrity. Thus, many studies for increasing the capacitance of a capacitor are being developed. There are various ways of increasing the capacitance such as forming a stacked or trench typed three-dimensional structure, whereby a surface area of a dielectric layer is increased.

In order to constitute a cell area in a DRAM fabrication, transistors and the like are formed on a semiconductor substrate, storage and plate electrodes of polycrystalline silicon and a dielectric layer are formed wherein the dielectric layer lies between the electrodes, and metal wires are formed to connect the devices one another.

The obtainable capacitance of the storage capacitor tends to decrease dependent upon the level of the miniaturization of the storage cell. On the other hand, the necessary capacitance of the capacitor is almost constant when the storing voltage to be applied across the capacitor is fixed. Therefore, it is necessary for the capacitor to compensate the capacitance decrease due to the miniaturization by, for example, increasing the surface area of the capacitor. This surface area increase has been popularly realized by increasing the thickness of the lower electrode (or, storage electrode) of the capacitor. A typical capacitor utilized in DRAM fabrication is the Metal Insulator Metal (MIM) capacitor, which is usually located in the memory region of DRAM and embedded DRAM to increase the capacitance of the capacitor.

In the conventional method of fabricating a semiconductor device, a polysilicon material is usually to be taken for the electrodes of the capacitors. In this case, the higher the temperature is used in the process of annealing on the dielectric thin film, the lesser the defect exists in the dielectric thin film.

In conventional embedded DRAM fabrication processes, a Co-salicide gate is generally utilized in association with logic circuits. The term "Salicide" generally refers to "self-aligned silicide" and is well known in the art of DRAM semiconductor fabrication. It is difficult to apply Co-salicide gate for use in memory cells. The root cause of this difficulty lies in the fact that in order to utilize a Co-salicide gate efficiently, it is necessary to possess enough of a gate to contact extension for window process, which resulted in the ability of the cell size to shrink efficiently. Although SAC (self-aligned contact) is generally better to utilize for gate resistance performance and is more compatible with logical processes, the SAC process is difficult to use in reducing cell size and continues to present drawbacks.

Thus, the present inventor has concluded that a need exists for a new process, which combines the salicide gate, and SAC process in the memory cell area without the need for extra mask and trading-off circuit performance.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved semiconductor fabrication method and system.

It is another aspect of the present invention to provide a method and system for fabricating a MIM capacitor.

It is yet another aspect of the present invention to provide a method and system for fabricating a MIM capacitor utilized in a DRAM-based semiconductor device.

It is yet another aspect of the present invention to combine a salicide gate and SAC (self-aligned contact) techniques in a memory cell without requiring an additional photo mask and trade-offs in circuit performance thereof.

The above and other aspects of the present invention are achieved as is now described. A method and system for fabricating a capacitor utilized in a semiconductor device. A salicide gate is designated for use with the semiconductor device. A self-aligned contact (SAC) may also be configured for use with the semiconductor device. The salicide gate and the self-aligned contact are generally in a memory cell area of the semiconductor device to thereby permit the efficient shrinkage of memory cell size without an additional mask or weakening of associated circuit performance. Combining, the self-aligned contact and the salicide gate in the same memory cell area can effectively reduce gate resistance.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

The present invention discloses a method and system fabricating a MIM capacitor utilized in a DRAM-based semiconductor device. A salicide gate is designated for use with the semiconductor device. A self-aligned contact (SAC) may also be configured for use with the semiconductor device. The salicide gate and the self-aligned contact are generally in a memory cell area of the semiconductor device to thereby permit the efficient shrinkage of memory cell size without an additional mask or weakening of associated circuit performance. Combining, the self-aligned contact and the salicide gate in the same memory cell area can effectively reduce gate resistance. (Note that Self-aligned contacts (SACs) can be utilized in many semiconductor technologies, such as DRAMs, SRAMs, and Flash memory.

Figure 1:
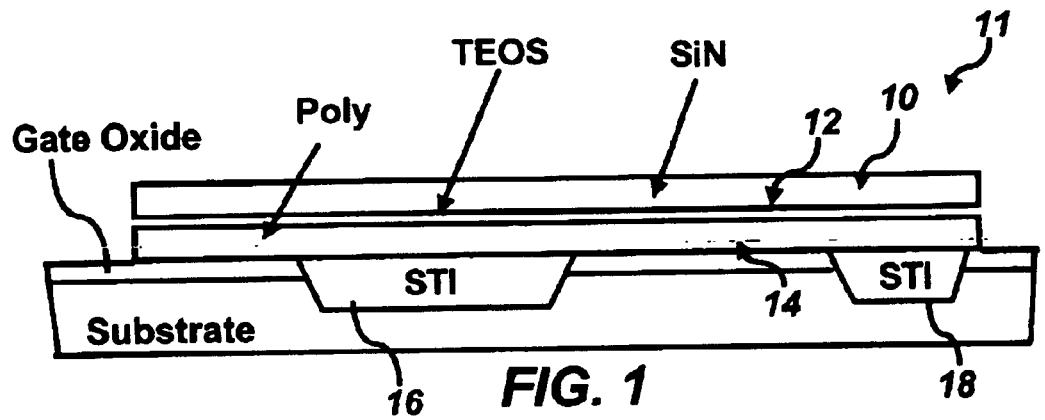
FIG. 1 illustrates a first step of a semiconductor fabrication process, in accordance with a preferred embodiment of the present invention.

FIG. 1 illustrates a first step 11 of a semiconductor fabrication process, in accordance with a preferred embodiment of the present invention. First step 11 indicates a poly deposition layer 14 located above STI 16 and 18. A TEOS deposition layer 12 is situated above poly deposition layer 14. Finally, an SIN deposition layer 10 is situated above TEOS deposition layer 12. Note that the acronym "TEOS," as utilized herein, refers to "Tetraethoxysilane." For brevity, however, the term TEOS will be utilized primarily herein. Thus, as indicated in first step 11, DRAM poly gate patterning may be performed utilizing a hard mask. Note that in FIGS. 1 to 15 herein, analogous parts are indicated by identical reference numerals. Thus, FIGS. 1 to 15 together represent a semiconductor fabrication process that may be implemented in accordance with a preferred or alternative embodiments of the present invention.

Figure 2:
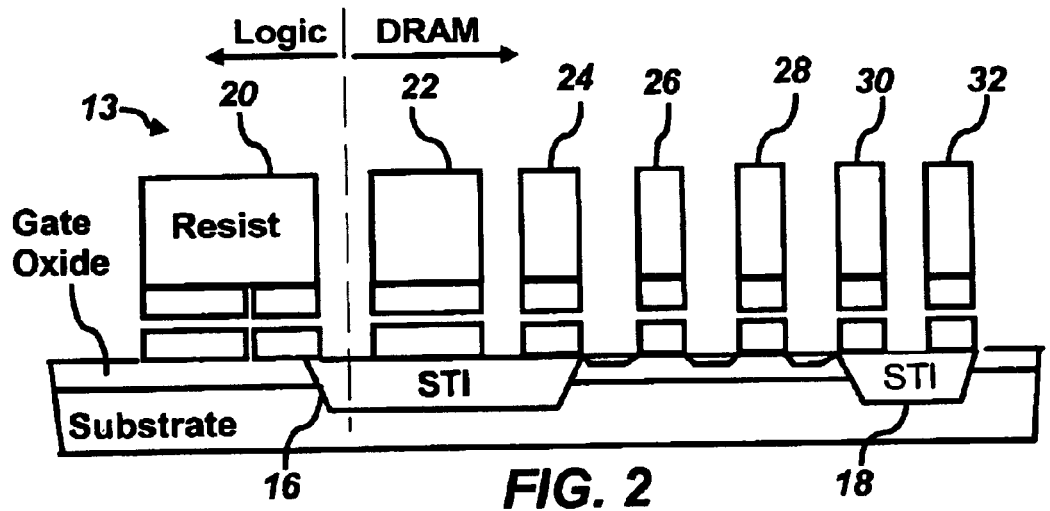
FIG. 2 illustrates a second step of a semiconductor fabrication process, in accordance with a preferred embodiment of the present invention.

FIG. 2 illustrates a second step 13 of the semiconductor fabrication process disclosed herein, in accordance with a preferred embodiment of the present invention. In second step 13, a poly gate can be defined (i.e., a DRAM gate is defined). Additionally, a cell LDD implant step can be performed as part of second step 13 as indicated by the formation of resists 20–32, which can assist in the formation of a drain or drain feature. Note that the acronym LDD, which is utilized herein, refers to the term "Lightly Doped Drain." The term "LDD" is well known in the semiconductor fabrication arts.

Figure 3:
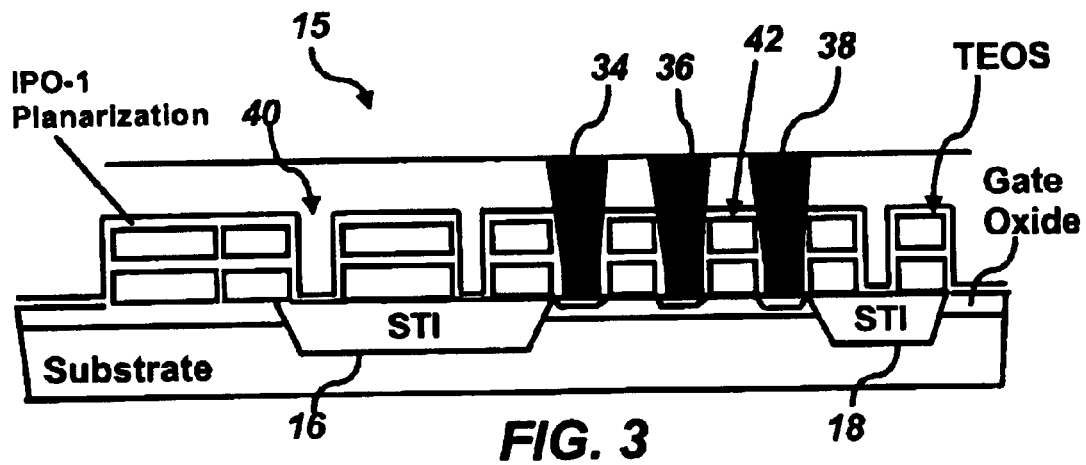
FIG. 3 depicts a third step of a semiconductor fabrication process, in accordance with a preferred embodiment of the present invention.

FIG. 3 depicts a third step 15 of a of the semiconductor fabrication process disclosed herein, in accordance with a preferred embodiment of the present invention. In third step 15 of FIG. 3, several elements are identified. For example, BPTEOS 40 is indicated in FIG. 3, along with TEOS, poly plugs 34, 36, 38, and SiN 42. Third step 15 illustrates a plug implant and poly-plug formation. A TEOS layer, SiN, and BPTEOS layers are thus deposited, and an IPO-1 planarization operation is performed. Note that as utilized herein, the acronym BPTEOS, which is well known in the art, refers to "Boro Phospho Tetra Etyle Ortho Silicate." Also, the acronym IPO refers generally to an inter-poly oxide (IPO) layer.

Figure 4:
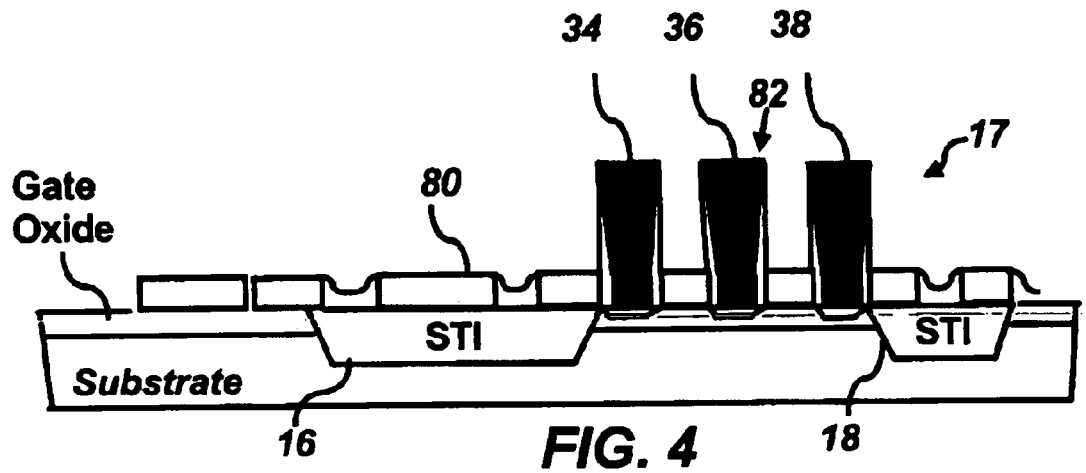
FIG. 4 illustrates a fourth step of a semiconductor fabrication process, in accordance with a preferred embodiment of the present invention.

FIG. 4 illustrates a fourth step 17 of the semiconductor fabrication process disclosed herein, in accordance with a preferred embodiment of the present invention. Fourth step 17 indicates that an anisotropic (oxide+SiN) etch back is performed to stop on a poly gate by utilizing a high selectivity between the poly layer and the oxide and SiN. Additionally, in FIG. 4, an un-doped poly layer 80 is illustrated, along with a doped poly layer 82. The operation illustrated in FIG. 4 thus involves an oxide/SiN etch back step.

Figure 5:
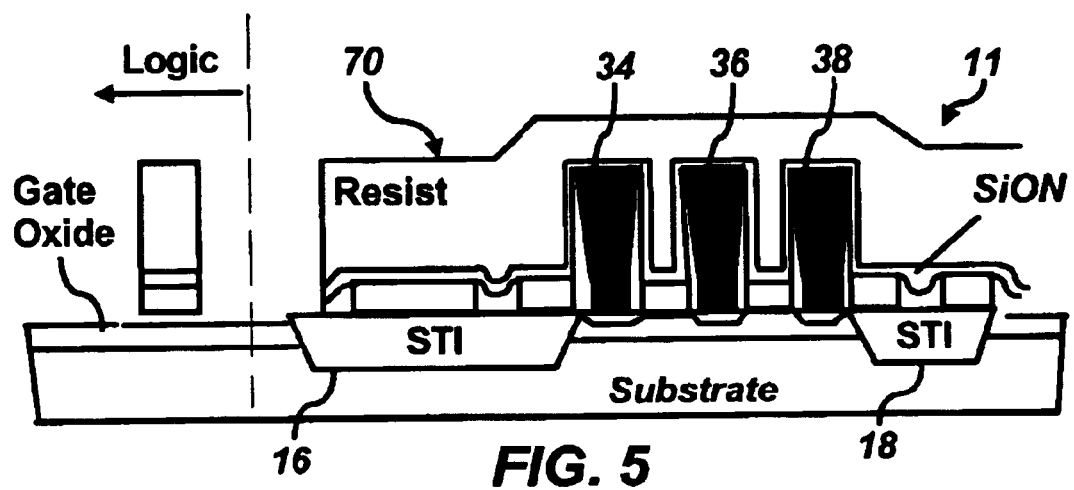
FIG. 5 depicts a fifth step of a semiconductor fabrication process, in accordance with a preferred embodiment of the present invention.
Figure 6:
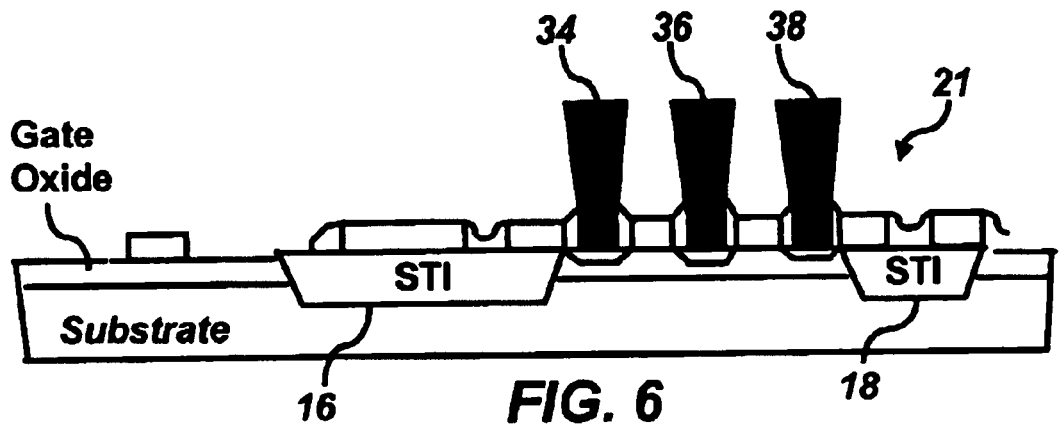
FIG. 6 illustrates a sixth step of a semiconductor fabrication process, in accordance with a preferred embodiment of the present invention
Figure 7:
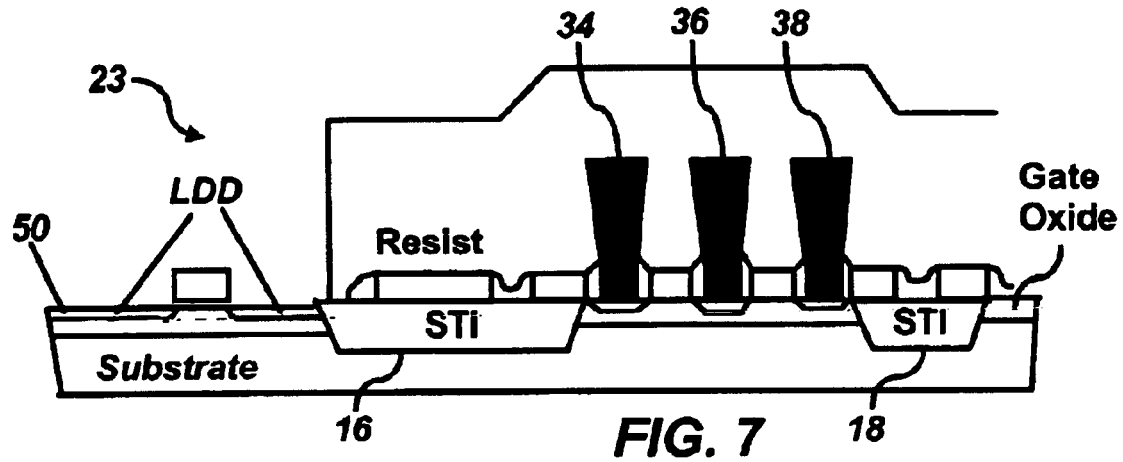
FIG. 7 depicts a seventh step of a semiconductor fabrication process, in accordance with a preferred embodiment of the present invention.

FIG. 5 depicts a fifth step 19 of the semiconductor fabrication process disclosed herein, in accordance with a preferred embodiment of the present invention. As indicated in FIG. 5, the poly gate (i.e., logic gate) is defined. A resist layer 70 is also indicated in FIG. 5. FIG. 6 illustrates a sixth step 21 of a semiconductor fabrication process, in accordance with a preferred embodiment of the present invention. As indicated in FIG. 6, the SiON layer is removed, and thereafter, as depicted FIG. 7, LDD implant 50 layer is deposited. FIG. 7 thus depicts a seventh step 23 of the semiconductor fabrication process disclosed herein, in accordance with a preferred embodiment of the present invention.

Figure 8:
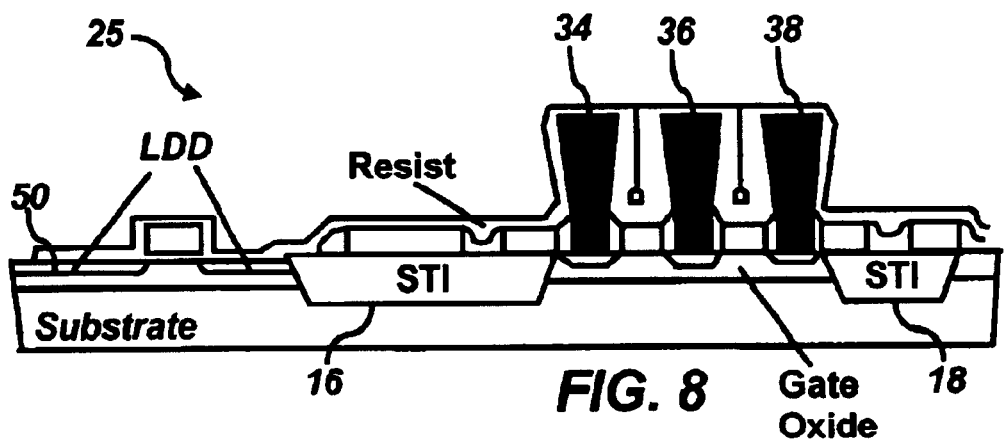
FIG. 8 illustrates an eighth step of a semiconductor fabrication process, in accordance with a preferred embodiment of the present invention.
Figure 9:
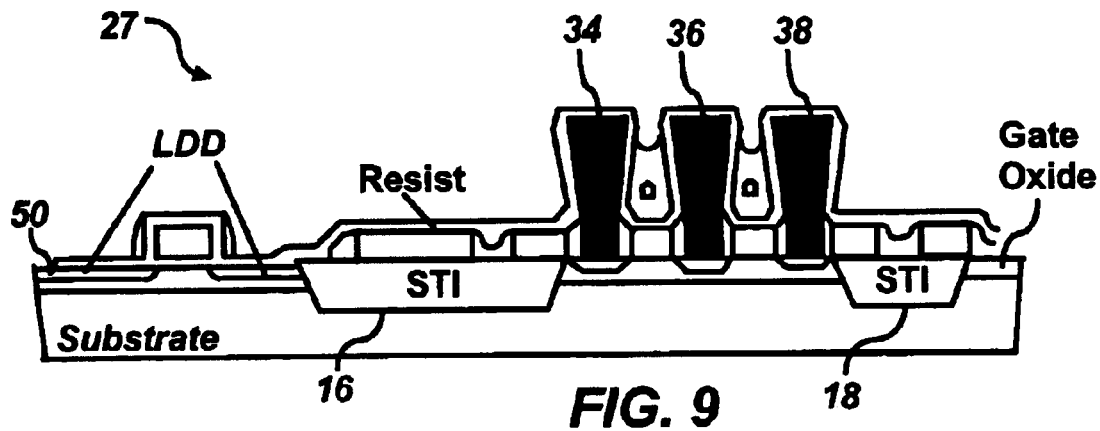
FIG. 9 depicts a ninth step of a semiconductor fabrication process, in accordance with a preferred embodiment of the present invention.
Figure 10:
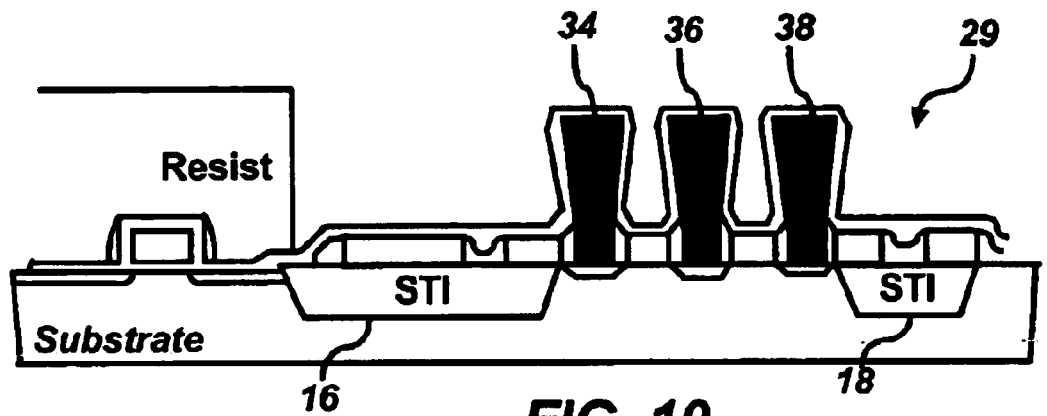
FIG. 10 illustrates a tenth step of a semiconductor fabrication process, in accordance with a preferred embodiment of the present invention.

FIG. 8 illustrates an eighth step 25 of the semiconductor fabrication process disclosed herein, in accordance with a preferred embodiment of the present invention. As indicated in FIG. 8, a spacer deposition comprising the following fabrication sequence takes place: TEOS/SiN/TEOS. FIG. 9 depicts a ninth step 27 of the semiconductor fabrication process disclosed herein, in accordance with a preferred embodiment of the present invention. As illustrated in FIG. 9, a spacer TEOS dry etch is performed, with a stop on SiN. Thereafter, as depicted in FIG. 10, a tenth step 29 of the semiconductor fabrication process disclosed herein, in accordance with a preferred embodiment of the present invention, can be performed. In this tenth step 29, a photo mask can be utilized to open the DRAM array, and a wet dip may be utilized to remove the space TEOS.

Figure 11:
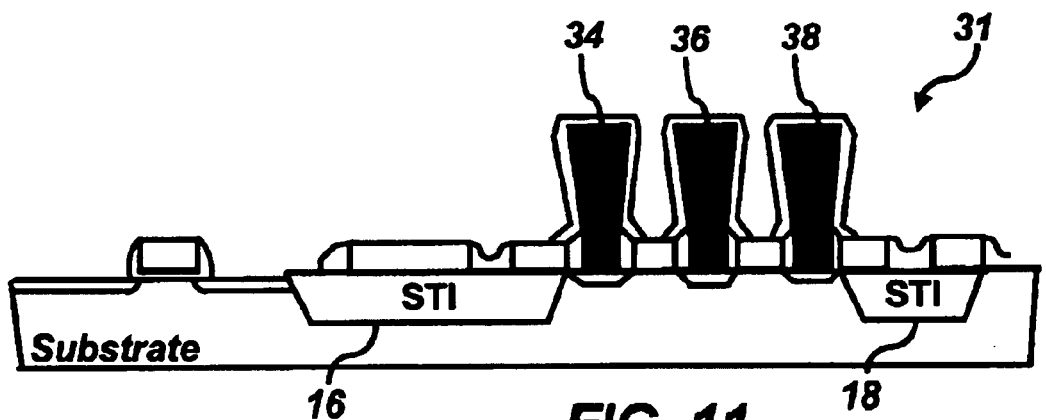
FIG. 11 depicts an eleventh step of a semiconductor fabrication process, in accordance with a preferred embodiment of the present invention.
Figure 12:
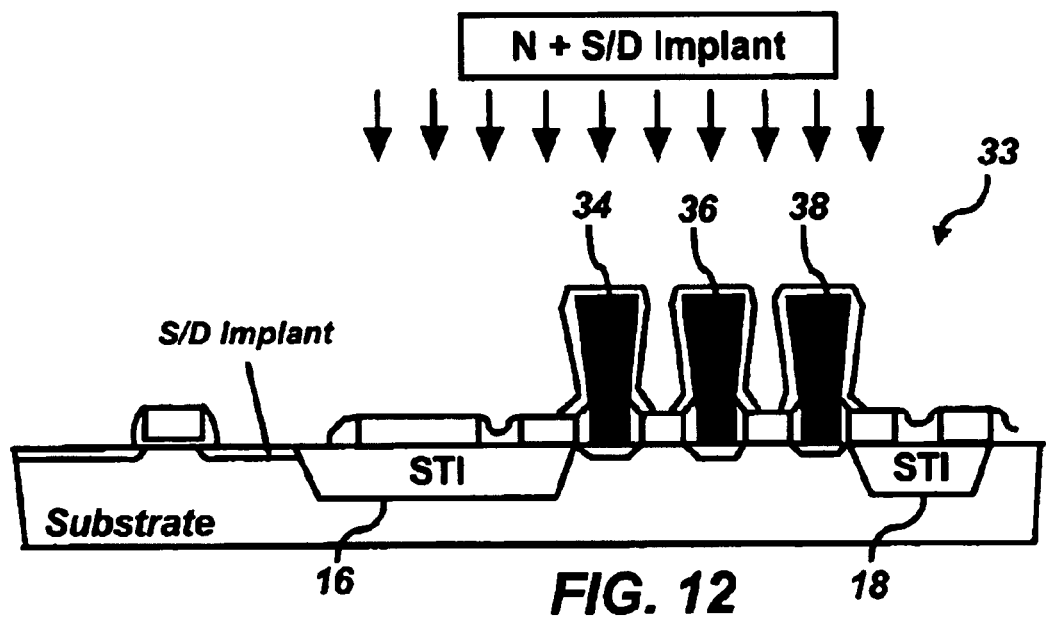
FIG. 12 illustrates a twelfth step of a semiconductor fabrication process, in accordance with a preferred embodiment of the present invention.

FIG. 11 depicts an eleventh step 31 of the semiconductor fabrication process disclosed herein, in accordance with a preferred embodiment of the present invention. According to the eleventh step 31, a spacer SiN dry etch is performed with a stop on TEOS. A wet dip can then be performed to remove the space TEOS. Next, as illustrated in FIG. 12, a twelfth step 33 of the semiconductor fabrication process can be performed, in accordance with a preferred embodiment of the present invention. As illustrated in FIG. 12, an S/D implant can be performed. The DRAM can also operate during an N+ S/D implant.

Figure 13:
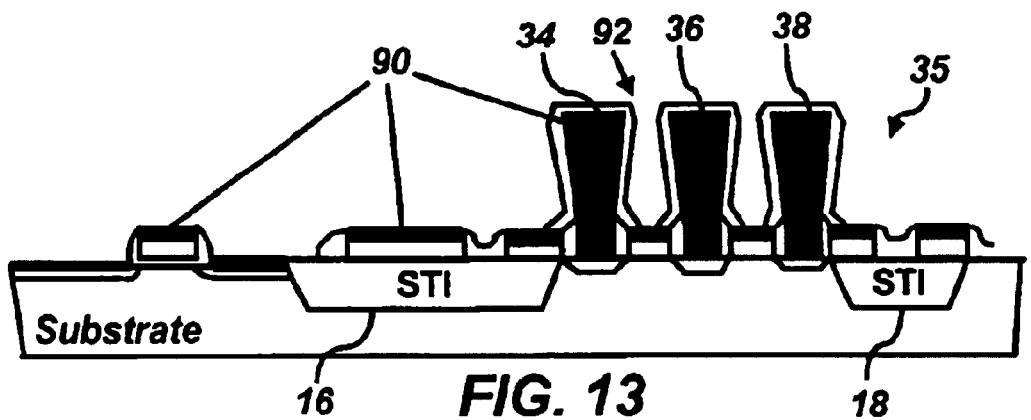
FIG. 13 depicts a thirteenth step of a semiconductor fabrication process, in accordance with a preferred embodiment of the present invention.

FIG. 13 depicts a thirteenth step 35 of the semiconductor fabrication process disclosed herein, in accordance with a preferred embodiment of the present invention. As indicated in FIG. 13, a photo and etch step can be performed, resulting in Co-Salicide formation. Co-Salicide 90 is illustrated in FIG. 13. Additionally, a SIN spacer 92 is depicted.

Figure 14:
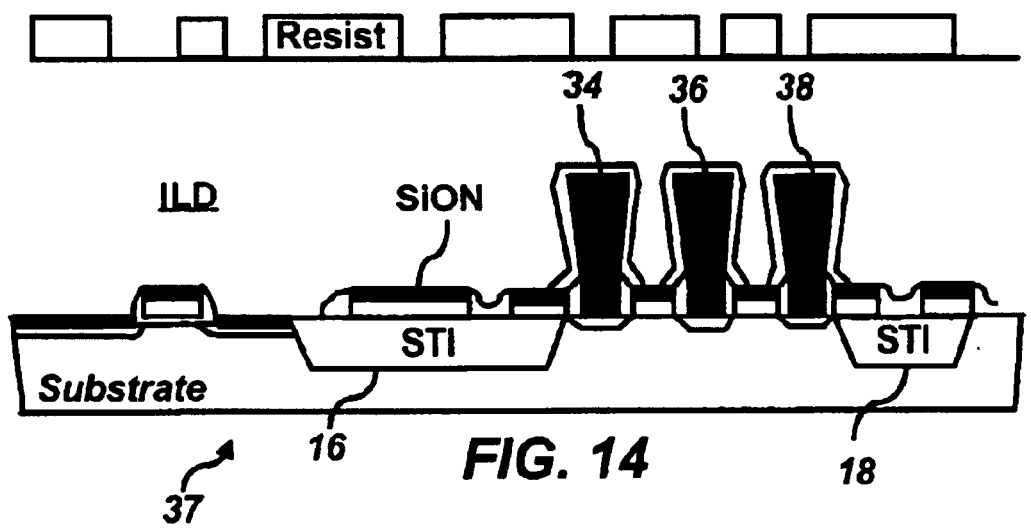
FIG. 14 illustrates a fourteenth step of a semiconductor fabrication process, in accordance with a preferred embodiment of the present invention.

FIG. 14 illustrates a fourteenth step 37 of the semiconductor fabrication process disclosed herein, in accordance with a preferred embodiment of the present invention. As indicated in FIG. 14, a SiON deposition step can be performed, along with an ILD deposition and flow operation.

Figure 15:
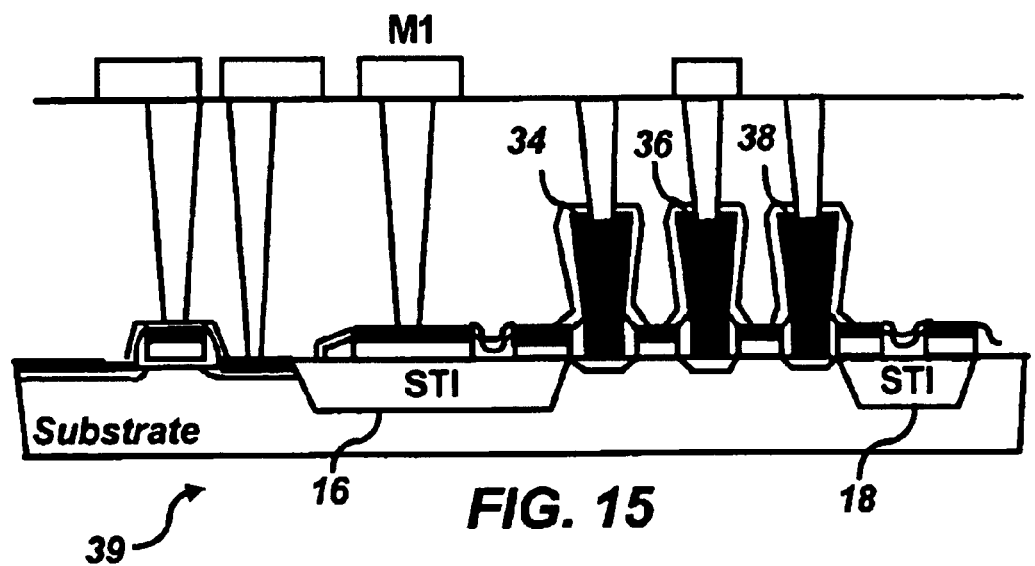
FIG. 15 depicts a fifteenth step of a semiconductor fabrication process, in accordance with a preferred embodiment of the present invention.

Finally, FIG. 15 depicts a fifteenth step 39 of the semiconductor fabrication process disclosed herein, in accordance with a preferred embodiment of the present invention. FIG. 15 depicts a W-plug formation and an M1 (i.e., metal one layer) photo and etch. An MIM capacitor may thus be formed between a metal one layer and a metal two layer for use in standard logic operations.

Figure 16:
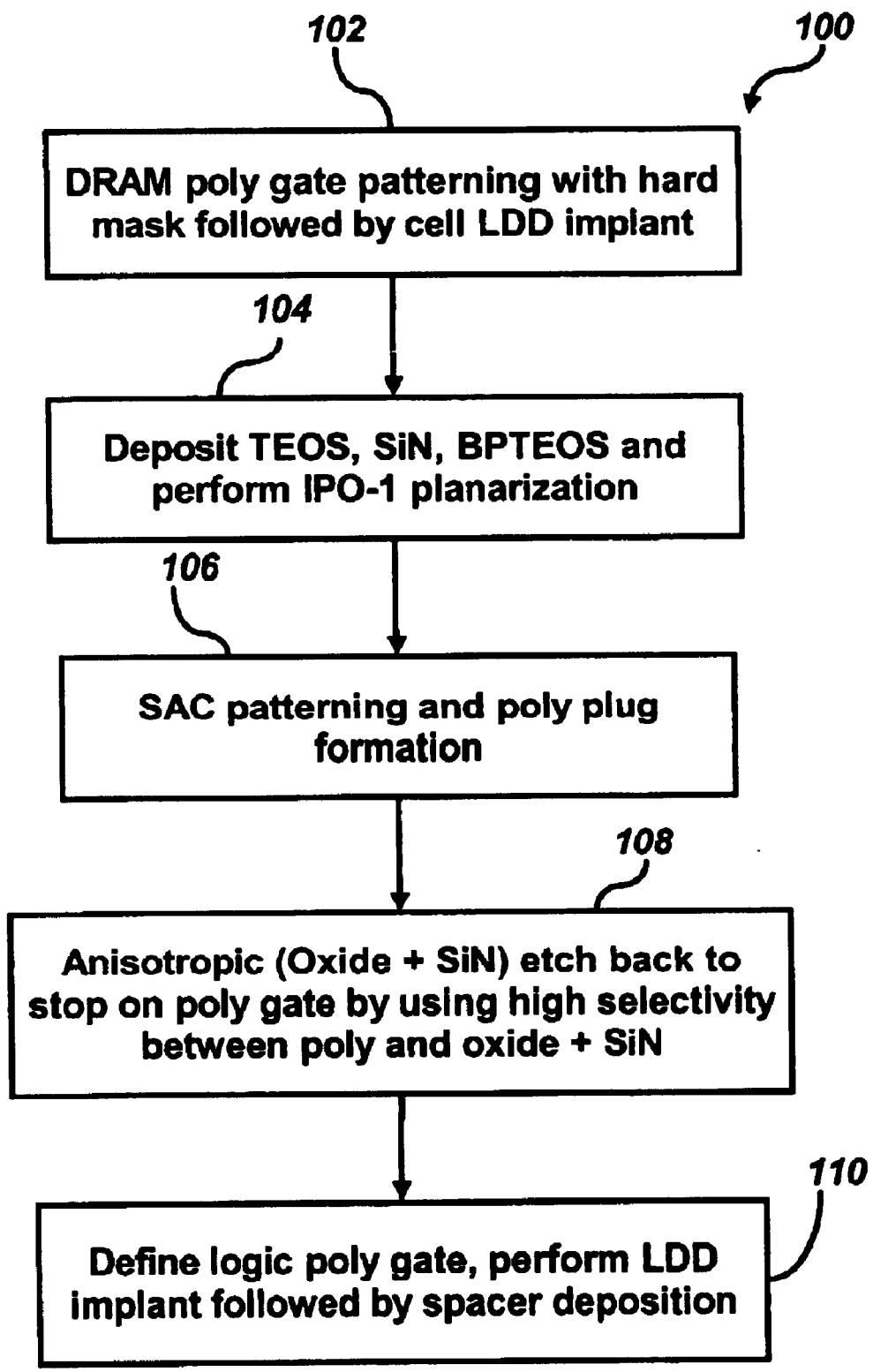
FIG. 16 illustrates a flow chart of operations illustrating operational steps that may be followed to implement a preferred embodiment of the present invention.

FIG. 16 illustrates a flow chart 100 of operations illustrating operational steps that may be followed to implement a preferred embodiment of the present invention. As described at block 102, a DRAM poly gate patterning operation may be performed with a hard mask, followed by a cell LDD implant. Thereafter, as illustrated at block 104, TEOS, Sin, and BPTEOS deposition steps may be implemented, followed by an IPO-1 planarization step. Then, as illustrated at block 106, SAC patterning and poly plug formation takes place. An example of this operation is illustrated specifically in FIG. 3 herein. As indicated next at block 108, an anisotropic (oxide and SiN) etch back is performed with a stop on the poly gate. This operation may be performed utilizing high selectivity between the poly gate and the oxide/SiN etch. An example of the oxide/SiN etch is illustrated in FIG. 4 herein. Next, as described at block 110, the logic poly gate is generally defined, along with the performance of an LDD implant followed by spacer deposition. An example of the logic poly gate defining step is illustrated in FIG. 5 herein.

Figure 17:
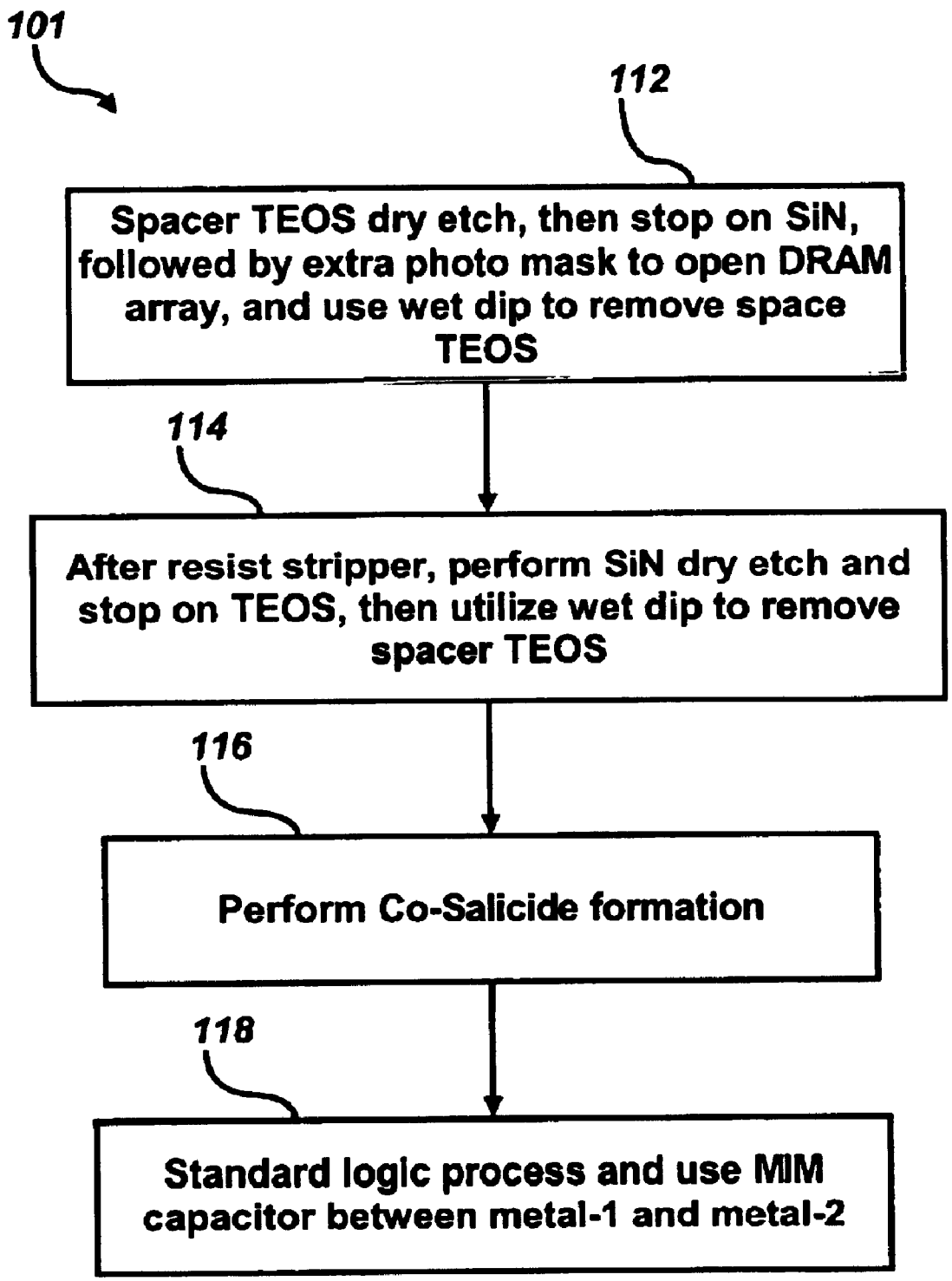
FIG. 17 depicts a flow of operations illustrating continued operational steps that may be followed to implement a preferred embodiment of the present invention.

FIG. 17 depicts a flow of operations 101 illustrating continued operational steps that may be followed to implement a preferred embodiment of the present invention. Note that the operations depicted in FIG. 17 represent continued operational steps that are described herein with reference to FIG. 16. Thus, the operation illustrated at block 112 of FIG. 17 can be processed immediately following the operation depicted at block 110. As indicated at block 112, a spacer TEOS dry etch may be performed with a stop on a SIN layer (e.g., see FIG. 9), and followed thereafter by an extra photo mask to open the DRAM array. A wet dip can be utilized to remove the spacer TEOS (e.g., see FIG. 10). After a resist stripper operation is performed, as illustrated at block 114, a SiN dry etch with a stop on TEOS can be processed. A wet dip may then be utilized to remove the space TEOS (e.g., see FIG. 11). Then, as illustrated at block 116, Co-Salicide formation takes place (e.g., see FIG. 13). Finally, as illustrated at block 118 standard logical processes may occur using an MIM capacitor formed between a metal one and metal two layer, as a result of the processing of the semiconductor fabrication steps described herein.

Based on the foregoing, it can be appreciated that a number of advantages can be obtained by implementing the fabrication method and system described herein. For example, the use of a DRAM poly gate with a Co-Salicide can effectively reduce gate resistance. Additionally, an extra metal layer is not required for word-line strapping designs. A conventional DRAM process requires one or more extra photo/etch steps to open a SiN/TEOS hard mask above a DRAM level six gate to avoid contacting an associated gate opening. Utilizing the method and system described herein, however, can reduce mask layers and associated processing costs. Perhaps most important, by implementing the method and system described herein for semiconductor fabrication, an SAC (self-aligned contact) can still be utilized, while effectively enabling the shrinkage of memory cell sizes. Finally, the method and system described herein permits a logic gate oxide to be utilized, along with an un-doped poly layer; therefore, the method and system described herein can be easily combined with logical processes. The invention described herein thus generally illustrates a new logic compatible embedded DRAM fabrication process for MIM capacitor devices.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for fabricating a semiconductor device comprising the steps of:

designating a salicide gate for use with said semiconductor device;

configuring a self-aligned contact for use with said semiconductor device; end patterning a poly gate on said substrate with a hard mask;

performing a cell implant thereof;

depositing sequentially TEOS, SiN, BPTEOS on said substrate;

performing an IPO-1 planarization upon a layer formed on said substrate; and combining said salicide gate and said self-aligned contact in a memory cell area of said semiconductor device to thereby permit the efficient shrinkage of memory cell size without an additional mask or weakening of associated circuit performance.

2. The method of claim 1 wherein said semiconductor device comprises a DRAM-based semiconductor device.

3. The method of claim 1 wherein said poly gate comprises a DRAM poly gate.

4. The method of claim 1 wherein said cell implant comprises a cell LDD implant.

5. A method for fabricating a semiconductor device comprising the steps of:

designating a salicide gate for use with said semiconductor device;

configuring a self-aligned contact for use with said semiconductor device;

patterning a poly gate on said substrate with a hard mask;

performing a cell implant thereof;

depositing sequentially TEOS, SiN, BPTEOS on said substrate;

performing an IPO-1 planarization upon a layer formed on said substrate;

combining said salicide gate and said self-aligned contact in a memory cell area of said semiconductor device to thereby permit the efficient shrinkage of memory cell size without an additional mask or weakening of associated circuit performance; and performing an anisotropic etch back thereof to stop on said poly gate utilizing high selectivity between said poly gate and said anisotropic etch back, wherein said anisotropic etch back comprises anisotropic etch back based on a combination of oxide and SiN.

6. A method for fabricating a semiconductor device comprising the steps of:

designating a salicide gate for use with said semiconductor device;

configuring a self-aligned contact for use with said semiconductor device;

patterning a poly gate on said substrate with a hard mask;

performing a cell implant thereof;

depositing sequentially TEOS, SiN, BPTEOS on said substrate; performing an IPO-1 planarization upon a layer formed on said substrate; and combining said salicide gate and said self-aligned contact in a memory cell area of said semiconductor device to thereby permit the efficient shrinkage of memory cell size without an additional mask or weakening of associated circuit performance;

defining a logic poly gate;

performing an LDD implant upon said substrate; and forming a spacer deposition layer upon said substrate.

7. The method of claim 6 further comprising the steps of:

performing a spacer TEOS dry etch followed by a stop at SiN;

utilizing an additional photo mask to open an associated DRAM array; and utilizing a wet dip upon said substrate and said layers thereof to remove a spacer TEOS.

8. The method of claim 7 further comprising the steps of:

performing a spacer SiN dry etch upon said substrate and said layers thereof followed by a stop on a TEOS; and utilizing a wet dip upon said substrate and said layers thereof to remove said spacer TEOS.

9. The method of claim 2 further comprising the step of:

forming a Co-salicide upon said substrate for use with said semiconductor device.

* * * * *